(12) United States Patent
Chang et al.

(10) Patent No.: US 8,890,144 B2
(45) Date of Patent: Nov. 18, 2014

(54) HIGH VOLTAGE SEMICONDUCTOR DEVICE

(75) Inventors: Pao-An Chang, Taoyuan County (TW);
Ching-Ming Lee, Miaoli County (TW);
Te-Yuan Wu, Hsinchu (TW);
Chih-Chung Wang, Hsinchu (TW);
Wen-Fang Lee, Hsinchu (TW);
Wei-Lun Hsu, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 266 days.

(21) Appl. No.: 13/414,723

(22) Filed: Mar. 8, 2012

(65) Prior Publication Data

US 2013/0234141 A1 Sep. 12, 2013

(51) Int. Cl.
*H01L 29/04* (2006.01)
*H01L 29/10* (2006.01)
*H01L 31/00* (2006.01)

(52) U.S. Cl.
USPC .............................. 257/52; 257/341; 438/156

(58) Field of Classification Search
None
See application file for complete search history.

(56) References Cited

U.S. PATENT DOCUMENTS

| | | | |
|---|---|---|---|
| 4,344,081 A | 8/1982 | Pao | |
| 4,396,999 A | 8/1983 | Malaviya | |
| 4,893,160 A | 1/1990 | Blanchard | |
| 4,918,333 A | 4/1990 | Anderson | |
| 4,958,089 A | 9/1990 | Fitzpatrick | |
| 5,040,045 A | 8/1991 | McArthur | |
| 5,268,589 A | 12/1993 | Dathe | |
| 5,296,393 A | 3/1994 | Smayling | |
| 5,326,711 A | 7/1994 | Malhi | |
| 5,346,835 A | 9/1994 | Malhi | |
| 5,430,316 A | 7/1995 | Contiero | |
| 5,436,486 A | 7/1995 | Fujishima | |
| 5,534,721 A | 7/1996 | Shibib | |
| 5,811,850 A | 9/1998 | Smayling | |
| 5,950,090 A | 9/1999 | Chen | |
| 5,998,301 A | 12/1999 | Pham | |
| 6,066,884 A | 5/2000 | Krutsick | |
| 6,144,538 A | 11/2000 | Chao | |
| 6,165,846 A | 12/2000 | Carns | |
| 6,177,704 B1 * | 1/2001 | Suzuki et al. | 257/343 |
| 6,245,689 B1 | 6/2001 | Hao | |
| 6,277,675 B1 | 8/2001 | Tung | |
| 6,277,757 B1 | 8/2001 | Lin | |
| 6,297,108 B1 | 10/2001 | Chu | |
| 6,297,534 B1 * | 10/2001 | Kawaguchi et al. | 257/341 |
| 6,306,700 B1 | 10/2001 | Yang | |

(Continued)

OTHER PUBLICATIONS

Ludikhuize, Performance and Innovative Trends in RESURF Technology, 2001.

*Primary Examiner* — Sonya D McCall Shepard
(74) *Attorney, Agent, or Firm* — Winston Hsu; Scott Margo

(57) ABSTRACT

A high voltage semiconductor device includes a substrate, an insulating layer positioned on the substrate, and a silicon layer positioned on the insulating layer. The silicon layer further includes at least a first doped strip, two terminal doped regions formed respectively at two opposite ends of the silicon layer and electrically connected to the first doped strip, and a plurality of second doped strips. The first doped strip and the terminal doped regions include a first conductivity type, the second doped strips include a second conductivity type, and the first conductivity type and the second conductivity type are complementary. The first doped strip and the second doped strips are alternately arranged.

16 Claims, 4 Drawing Sheets

(56) References Cited

U.S. PATENT DOCUMENTS

| | | |
|---|---|---|
| 6,326,283 B1 | 12/2001 | Liang |
| 6,353,247 B1 | 3/2002 | Pan |
| 6,388,292 B1 | 5/2002 | Lin |
| 6,400,003 B1 | 6/2002 | Huang |
| 6,424,005 B1 | 7/2002 | Tsai |
| 6,514,830 B1 | 2/2003 | Fang |
| 6,521,538 B2 | 2/2003 | Soga |
| 6,614,089 B2 | 9/2003 | Nakamura |
| 6,713,794 B2 | 3/2004 | Suzuki |
| 6,750,524 B2 | 6/2004 | Parthasarthy et al. |
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,819,184 B2 | 11/2004 | Pengelly |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh |
| 6,869,848 B2 | 3/2005 | Kwak |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,075,575 B2 | 7/2006 | Hynecek |
| 7,091,079 B2 | 8/2006 | Chen |
| 7,148,540 B2 | 12/2006 | Shibib |
| 7,214,591 B2 | 5/2007 | Hsu |
| 7,309,636 B2 | 12/2007 | Chen |
| 7,323,740 B2 | 1/2008 | Park |
| 7,358,567 B2 | 4/2008 | Hsu |
| 7,427,552 B2 | 9/2008 | Jin |
| 7,531,888 B2 | 5/2009 | Cai |
| 2003/0022460 A1 | 1/2003 | Park |
| 2004/0018698 A1 | 1/2004 | Schmidt |
| 2004/0070050 A1 | 4/2004 | Chi |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0199344 A1* | 9/2006 | Tanaka .................. 438/299 |
| 2006/0261407 A1 | 11/2006 | Blanchard |
| 2006/0270134 A1 | 11/2006 | Lee |
| 2006/0270171 A1 | 11/2006 | Chen |
| 2007/0041227 A1 | 2/2007 | Hall |
| 2007/0082440 A1 | 4/2007 | Shiratake |
| 2007/0132033 A1 | 6/2007 | Wu |
| 2007/0273001 A1 | 11/2007 | Chen |
| 2007/0290261 A1 | 12/2007 | Chiang et al. |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2009/0108348 A1 | 4/2009 | Yang |
| 2009/0111252 A1 | 4/2009 | Huang |
| 2009/0159966 A1 | 6/2009 | Huang |
| 2009/0278208 A1 | 11/2009 | Chang |
| 2009/0294865 A1 | 12/2009 | Tang |
| 2010/0006937 A1 | 1/2010 | Lee |
| 2010/0032758 A1 | 2/2010 | Wang |
| 2010/0096702 A1 | 4/2010 | Chen |
| 2010/0148250 A1 | 6/2010 | Lin |
| 2010/0213517 A1 | 8/2010 | Sonsky |
| 2011/0057263 A1 | 3/2011 | Tang |

* cited by examiner

HIGH VOLTAGE SEMICONDUCTOR DEVICE

BACKGROUND OF THE INVENTION

1. Field of the Invention

The invention relates to a high voltage (HV) semiconductor device, and more particularly, to a HV semiconductor device capable of easily being integrated with metal-oxide-semiconductor (MOS) transistor device.

2. Description of the Prior Art

Transistor device serves as the device for ON/OFF switching or for amplifying signals. For example, bipolar junction transistor (BJT) devices are widely used in early solid-state electronic circuit. With the demands for high-speed, low-cost, and small-sized devices are eagerly met, metal-oxide-semiconductor field transistor (MOSFET) devices are now prevalently used in nowadays integrated circuits.

Typically, the conventional MOSFET devices have breakdown voltages less than approximately 100 volts (V). Such low breakdown voltage prevents utilizing the conventional MOSFET devices in high voltage applications of 500V or in super high voltage applications of 1200V. Therefore a semiconductor device capable of performing in the high voltage or super high voltage applications is still in need.

SUMMARY OF THE INVENTION

According to an aspect of the present invention, a high voltage (HV) semiconductor device is provided. The HV semiconductor device includes a substrate, an insulating layer positioned on the substrate, and a silicon layer positioned on the insulating layer. The silicon layer further includes at least a first doped strip, two terminal doped regions formed respectively at two opposite ends of the silicon layer and electrically connected to the first doped strip, and a plurality of second doped strips. The first doped strip and the terminal doped regions include a first conductivity type, the second doped strips include a second conductivity type, and the first conductivity type and the second conductivity type are complementary. The first doped strip and the second doped strips are alternately arranged.

Accordingly, the HV semiconductor device provided by the present invention is easily integrated with the MOS transistor device in the state of the art and serves as an efficacious protection element for the MOS transistor device. More important, because the HV voltage drops when passing through the first doped strip, a normal voltage MOS transistor device with which the HV semiconductor device of the present invention serves is integrated acts as a HV MOS transistor. Furthermore, when the HV semiconductor device is integrated with a HV MOS transistor device, the high voltage significantly drops even before being introduced into the HV MOS transistor device. Accordingly, high-voltage endurance of the HV-MOS transistor device with which the HV semiconductor device is integrated is further improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-3 are schematic drawings illustrating a HV semiconductor device provided by a first preferred embodiment of the present invention, wherein:

FIG. 2 is a top view of a portion of the HV semiconductor device emphasized by a dotted line in FIG. 1, and FIG. 3 is an enlarged view of a portion of the HV semiconductor device in FIG. 2.

DETAILED DESCRIPTION

Figure 1:
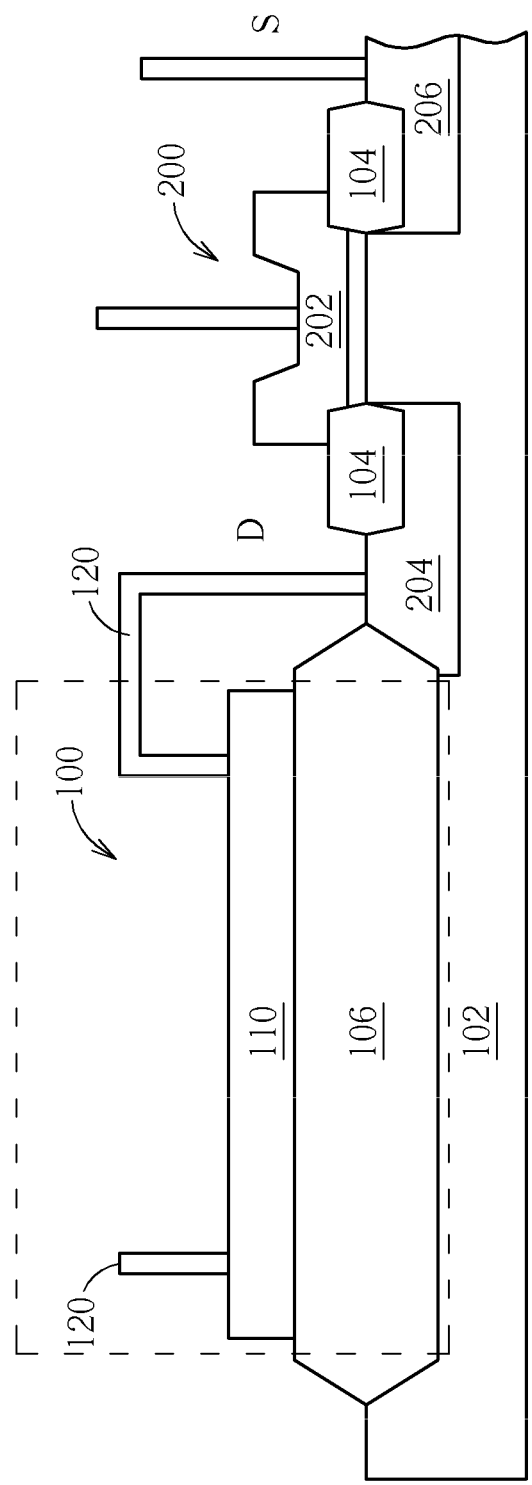
Figure 2:
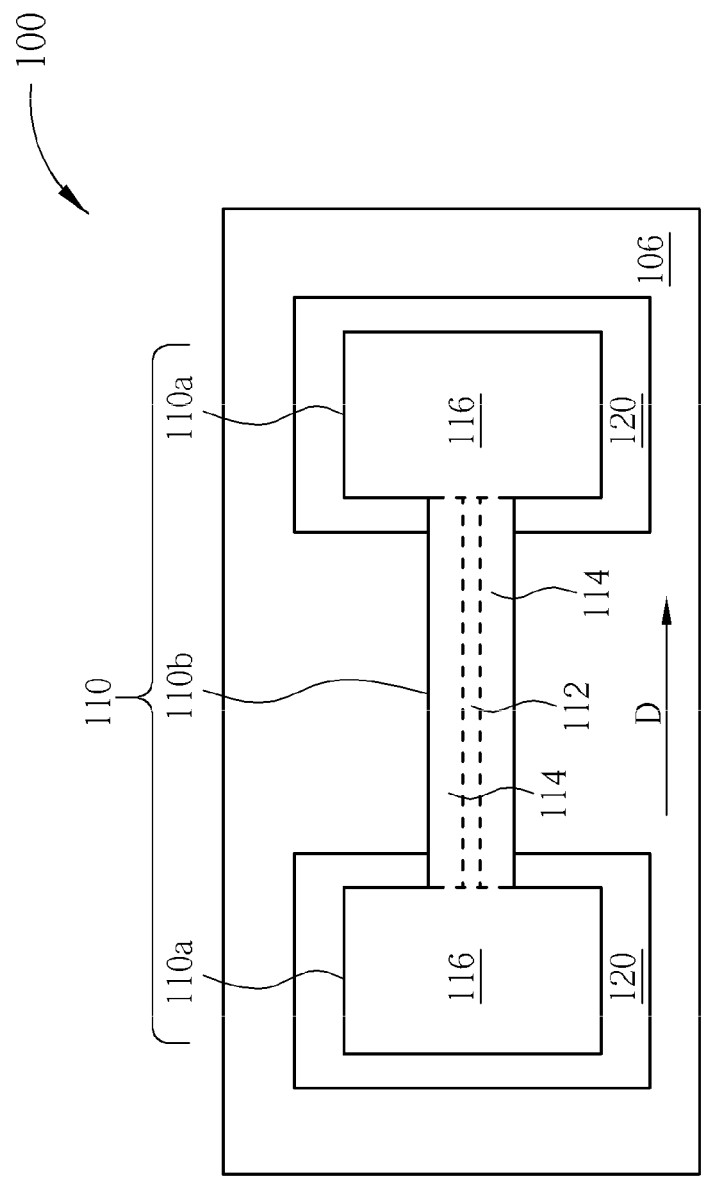
Figure 3:
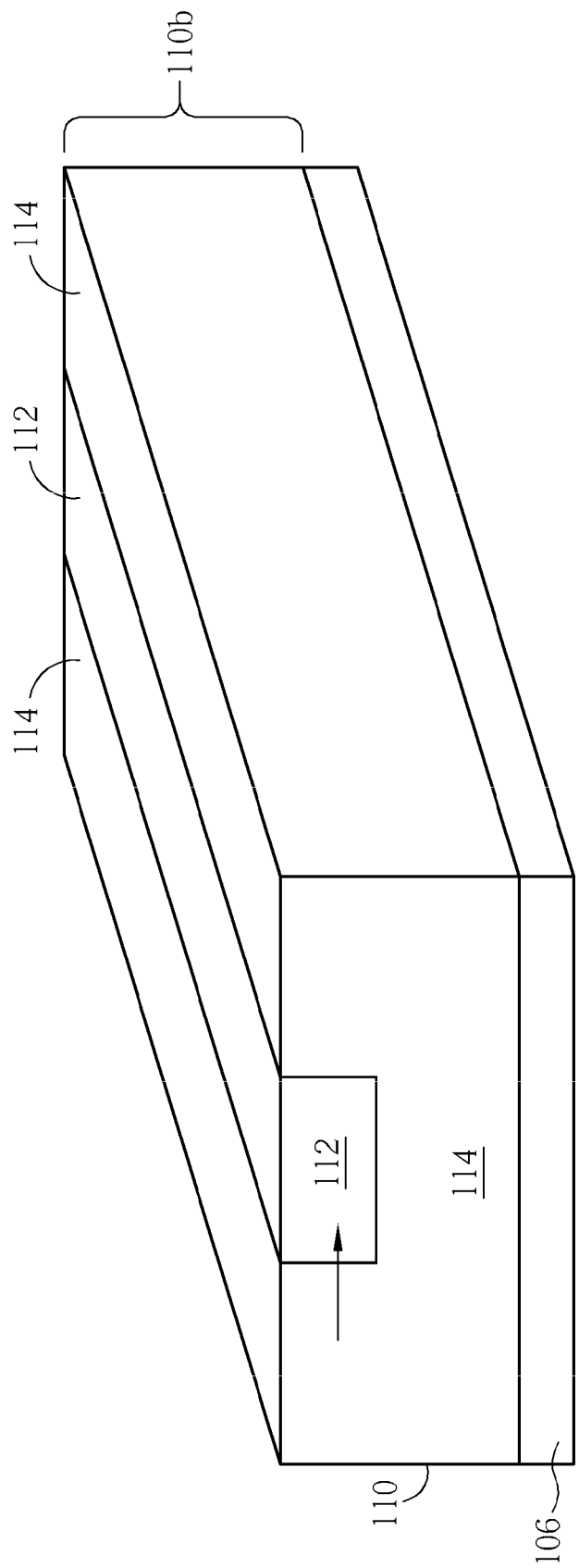

Please refer to FIGS. 1-3, which are schematic drawings illustrating a HV semiconductor device provided by a first preferred embodiment of the present invention, wherein FIG. 2 is a top view of a portion of the HV semiconductor device emphasized by a dotted line in FIG. 1, and FIG. 3 is an enlarged view of a portion of the HV semiconductor device in FIG. 2. As shown in FIG. 1 and FIG. 2, the HV semiconductor device 100 provided by the preferred embodiment includes a substrate 102. A plurality of devices for constructing integrated circuits (ICs) is formed on the substrate 102. For example, a MOS transistor device 200, such as a normal-voltage MOS transistor device or a HV MOS transistor device is formed on the substrate 102 as shown in FIG. 1. The MOS transistor device 200 includes a gate 202, a first doped region 204, and a second doped region 206. The first doped region 204 and the second doped region 206 can be a lightly-doped drain (LDD) or a drift region for the MOS transistor device 200. The MOS transistor device 200 is connected to the HV semiconductor device 100 by a conductor material. The connection point 120 is a Drain side (D) of the MOS transistor device 200, and another side connected to the second doped region 206 is a Source position (S). Additionally, the MOS transistor device 200 selectively includes an insulating structure 104 such as a field oxide (FOX) layer or a shallow trench isolation (STI) formed in the substrate 102 at the edge of the gate 202. Furthermore, the substrate 102 includes an insulating layer 106 having size different from the insulating structures 104. The insulating layer 106 is provided to accommodate the HV semiconductor device of the preferred embodiment. The insulating layer 106 can be a FOX layer or a STI.

Please refer to FIGS. 1-3. The HV semiconductor device 100 provided by the preferred embodiment further includes a silicon layer 110 positioned on the insulating layer 106 and spaced apart from the substrate 102 by the insulating layer 106 as shown in FIGS. 1-3. According to the preferred embodiment, the silicon layer 110 can be an amorphous layer or a polysilicon layer. The silicon layer 110 includes two opposite ends 110a and a straight-line portion 110b physically connected to the ends 110a as shown in FIG. 2. Please note that FIG. 3 that is the schematic drawing illustrates the straight-line portion 110b. The silicon layer 110 includes two opposite terminal doped regions 116, respectively positioned in the two ends 110a of the silicon layer 110. The terminal doped regions 116 respectively include a first conductivity type. According to the preferred embodiment, the first conductivity type is an n-type. Please refer to FIG. 2 and FIG. 3. At least a first doped strip 112 is formed in the silicon layer 110, particularly formed in the straight-line portion 110b. The first doped strip 112 and the straight-line portion 110b extend along a same direction D and two opposite ends of the first doped strip 112 respectively electrically connected to the terminal doped regions 116. The first doped strip 112 also includes the first conductivity type. In other words, the first doped strip 112 is an n-type doped region. It is noteworthy that the first doped strip 112 includes a first dopant concentration, the terminal doped regions 116 include a second dopant concentration, and the second dopant concentration is larger than the first dopant concentration.

Please still refer to FIG. 3. The straight-line portion 110b of the silicon layer 110 further includes a plurality of second doped strips 114. The second doped strips 114 include a second conductivity type complementary to the first conductivity type, and thus the second doped strips 114 are p-type doped regions. As shown in FIG. 3, the second doped strips 114 extend along a direction the same with the straight-line portion 110b. Furthermore, the second doped strips 114 and the first doped strip 112 are alternately arranged, and two opposite ends of each second doped strip 114 physically contact the terminal doped regions 116. It is noteworthy that bottoms of the second doped strips 114 are all physically contacted with and electrically connected to each other. Therefore, the HV semiconductor device 100 includes the plurality of the second doped strips 114 from top view while those second doped strips 114 form a continuous structure by the connected and joined bottoms. More important, since the bottoms of the second doped strips 114 are all contacted with and electrically connected to each other, the second doped strips 114 surround the first doped strip 112, and contact a bottom and sidewalls of the first doped strip 112 as shown in FIG. 3.

Please refer to FIGS. 1-3. It should be noted that the extending directions D of the straight-line portion 110b of the silicon layer 110, the first doped strip 112, and the second doped strips 114 are parallel with a current flow direction. As shown in FIG. 1, the HV semiconductor device 100 provided by the preferred embodiment can be electrically to the first doped region 204 of the MOS transistor device 200 through a connecting line 120. In a case that the MOS transistor device 200 is in the OFF state while a signal of high voltage is introduced to a terminal 110a of the HV semiconductor device 100, electrons in the n-type first doped strip 112 are to fill the holes in the p-type second doped strips 114, promptly. In the same time, the holes in the p-type second doped strips 114 are swept to the electrons in the n-type first doped strip 112, promptly. Consequently, the silicon layer 110, particularly the straight-line portion 110b is fully-depleted and a space capacitor is formed. More important, the HV signal is clamped in the fully depletion region in the straight-line portion 110b and blocked from the MOS transistor device 200. Briefly speaking, the HV semiconductor device 100 provided by the preferred embodiment protects the MOS transistor device 200 in the OFF state from being damaged by the introduced and unbearable high voltage. Furthermore, the MOS transistor device 200 obtains a benefit of lower leakage current due to the integrated HV semiconductor device 100.

In another case that the MOS transistor device 200 is in the ON state while a signal of high voltage is introduced to the terminal 110a of the HV semiconductor device 100: It is noteworthy that the first doped strip 112 serves as a drift region and thus the HV signal is dropped when passing through the first doped strip 112. Thereby, the HV signal becomes a bearable and acceptable signal to the MOS transistor device 200. More important, since the straight-line portion 110b possesses a specific p-n-p structure composed of the first doped strip 112 and the second doped strips 114 alternately arranged, the straight-line portion 110b provides a Reduced Surface Field (RESURF) effect which increases the breakdown voltage (BV) of the MOS transistor device 200 and decreases the on-resistance ($R_{ON}$) of the MOS transistor device 200. Accordingly, when the MOS transistor device 200 of the preferred embodiment is a normal voltage device, the HV semiconductor device 100 electrically connected to the normal voltage MOS transistor device 200 provides a drift region for the MOS transistor device 200, and thus a HV device composed of the HV semiconductor device 100 and the MOS transistor device 200 is obtained. When the MOS transistor device 200 of the preferred embodiment is a high voltage device, the HV semiconductor device 100 electrically connected to the HV-MOS transistor device 200 provides a signal which is dropped before introducing the drift region 204 of the HV-MOS transistor device 200. Therefore, high-voltage endurance of the HV-MOS transistor device 200 with which the HV semiconductor device 100 is integrated is further improved.

Accordingly, the HV semiconductor device 100 provided by the present invention is easily integrated with the MOS transistor device 200 in the state of the art. When the MOS transistor device 200 is in the OFF state, the HV semiconductor device 100 renders a full depletion region and blocks the HV signal from MOS transistor device 200, and thus serves as an efficacious protection element for the MOS transistor device 200. When the MOS transistor device 200 is in the ON state, the HV semiconductor device 100 renders a drift region and the HV signal is dropped when passing through the first doped strip 112. Therefore the high-voltage endurance of the HV-MOS transistor device 200 is further improved.

Figure 4:
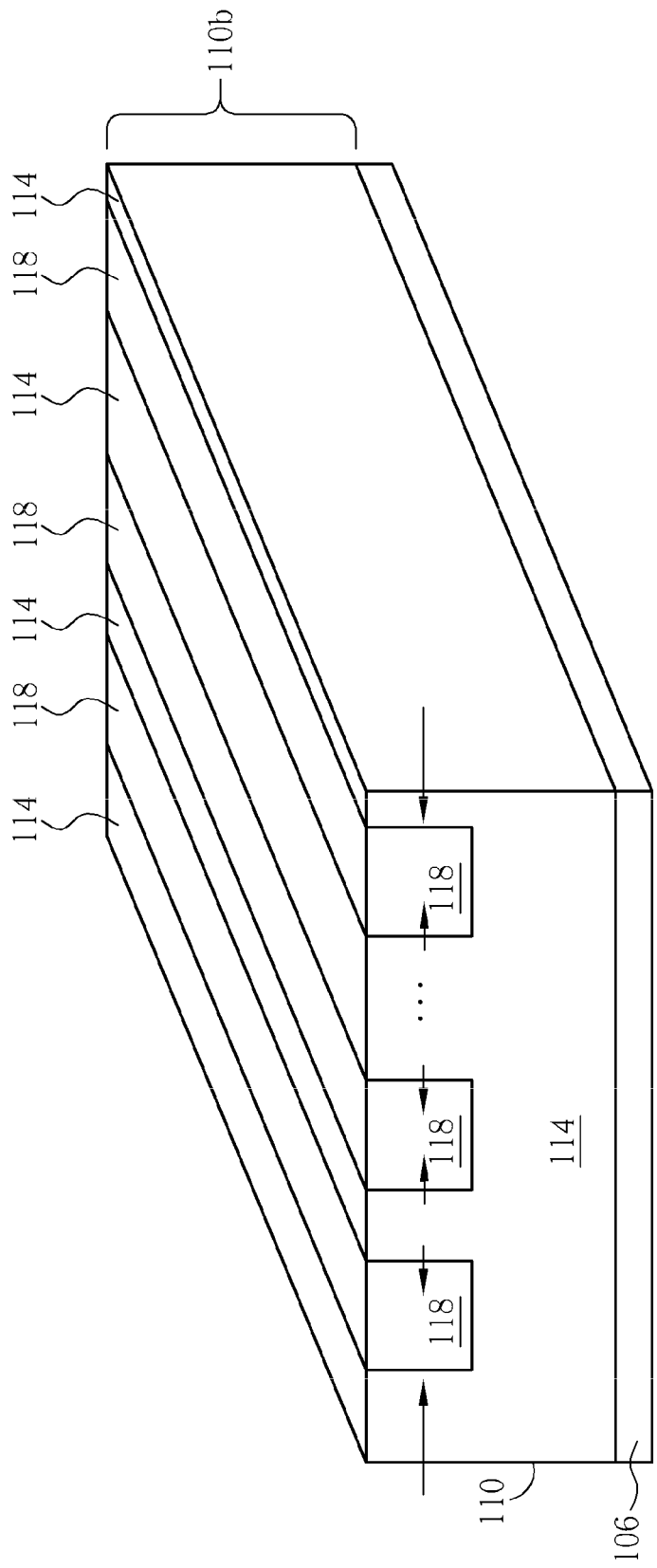
FIG. 4 is a schematic drawing illustrating a portion of a HV semiconductor device provided by a second preferred embodiment of the present invention.

Please refer to FIG. 4, which is a schematic drawing illustrating a portion of a HV semiconductor device provided by a second preferred embodiment of the present invention. It is noteworthy that elements the same in both of the first and second preferred embodiments are designated by the same numerals. Furthermore, the spatial relationships between those elements are the same with that described in the first preferred embodiment, thus those details are omitted for simplicity. The difference between the second preferred embodiment and the first preferred embodiment is: the straight-line portion 110b of the silicon layer 110 includes a plurality of first doped strips 118 which are all spaced apart from each other. As mentioned above, an extending direction D of the first doped strips 118 are the same with that of the straight-line portion 110b and of the second doped strips 114. And the first doped strips 118 and the second doped strips 114 are alternately arranged. In other words, the first doped strips 118 and the second doped strips 114 are parallel with each other. Also, the first doped strips 118 include the first conductivity type and the second doped strips 114 include the second conductivity type. It is noteworthy that bottoms of the second doped strips 114 are physically contacted with and electrical connected to each other in the preferred embodiment. Therefore, the HV semiconductor device 100 includes the plurality of the second doped strips 114 from top view while those the second doped strips 114 form a continuous structure by the connected and joined bottoms. More important, since the bottoms of the second doped strips 114 are all contacted with and electrically connected to each other, the second doped strips 114 surround the first doped strips 118, and contact the bottoms and sidewalls of the first doped strips 118 as shown in FIG. 4.

According to the HV semiconductor device 100 provided by the preferred embodiment, the straight-line portion 110b possesses a specific p-n-p-n . . . p-n-p structure composed of the first doped strips 118 and the second doped strips 114 alternately arranged. When the MOS transistor device 200 is in the OFF state, the HV semiconductor device 100 renders a full depletion region and blocks the HV signal from MOS transistor device 200. Thus the HV semiconductor device 100 serves as an efficacious protection element for the MOS transistor device 200. When the MOS transistor device 200 is in the ON state, the first doped strips 118 of the HV semiconductor device 100 serve as drift regions and provide the RESURF effect due to the specific p-n-p-n . . . p-n-p structure, therefore the HV signal is dropped when passing through each of the first doped strips 118. Accordingly, the BV of the MOS transistor device 200 is improved while the $R_{ON}$ of the MOS transistor device 200 is reduced.

Accordingly, the HV semiconductor device provided by the present invention is easily integrated with the MOS transistor device of normal voltage or high voltage in the state of the art. When the normal voltage or high voltage MOS transistor device is in the OFF state, the HV semiconductor device promptly renders a full depletion region and blocks the HV signal from MOS transistor device. Thus the HV semiconductor device serves as an efficacious protection element for the normal voltage or high voltage MOS transistor device. When the normal voltage or high voltage MOS transistor device is in the ON-state, the HV semiconductor device renders drift region(s) and further provides a RESURF effect. Therefore the high-voltage endurance of the HV-MOS transistor device with which the HV semiconductor device is integrated is further improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high voltage (HV) semiconductor device comprising:
   a substrate;
   an insulating layer positioned on the substrate; and
   a silicon layer positioned on the insulating layer, the silicon layer further comprising:
   at least a first doped strip comprising a first conductivity type;
   two terminal doped regions formed respectively at two opposite ends of the silicon layer and electrically connected to the first doped strip, the terminal doped regions respectively comprising the first conductivity type; and
   a plurality of second doped strips comprising a second conductivity type complementary to the first conductivity type, the second doped strips and the first doped strip are alternately arranged, wherein the second doped strips contact the insulating layer and surround the first doped strip.

2. The HV semiconductor device according to claim 1, wherein the silicon layer and the substrate are spaced apart from each other by the insulating layer.

3. The HV semiconductor device according to claim 1, wherein the insulating layer comprises a field oxide (FOX) layer or a shallow trench isolation (STI).

4. The HV semiconductor device according to claim 1, wherein the silicon layer provides a fully-depleted region.

5. The HV semiconductor device according to claim 1, wherein the silicon layer is electrically connected to a normal-voltage metal-oxide-semiconductor (MOS) transistor device or a high-voltage MOS transistor device.

6. The HV semiconductor device according to claim 1, wherein the silicon layer comprises a polysilicon layer or an amorphous silicon layer.

7. The HV semiconductor device according to claim 1, wherein the second doped strips contact a bottom and sidewalls of the first doped strip.

8. The HV semiconductor device according to claim 1, wherein the first doped strip and the second doped strips extend along a direction.

9. The HV semiconductor device according to claim 1, wherein the first doped strip comprises a first dopant concentration and the terminal doped regions comprise a second dopant concentration.

10. The HV semiconductor device according to claim 8, wherein the direction is parallel with a current flow direction.

11. The HV semiconductor device according to claim 9, wherein the second dopant concentration is larger than the first dopant concentration.

12. The HV semiconductor device according to claim 9, further comprising a plurality of third doped strips formed in the silicon layer, and the third doped strips are parallel with the first doped strip and the second doped strips.

13. The HV semiconductor device according to claim 12, wherein the third doped strips comprise the first conductivity type.

14. The HV semiconductor device according to claim 12, wherein the second doped strips surround the third doped strips.

15. The HV semiconductor device according to claim 13, wherein the third doped strips comprise a third dopant concentration, and the third concentration is identical to the first dopant concentration.

16. The HV semiconductor device according to claim 14, wherein the second doped strips contact bottoms and sidewalls of the third doped strips.

* * * * *